United States Patent
Wang et al.

(10) Patent No.: US 11,954,020 B2
(45) Date of Patent: Apr. 9, 2024

(54) MEMORY ADAPTIVE TEMPERATURE CONTROLLING METHOD, STORAGE DEVICE AND CONTROL CIRCUIT UNIT

(71) Applicant: Hefei Core Storage Electronic Limited, Anhui (CN)

(72) Inventors: Chih-Ling Wang, Anhui (CN); Qi-Ao Zhu, Anhui (CN); Xu Hui Cheng, Anhui (CN)

(73) Assignee: Hefei Core Storage Electronics Limited, Anhui (CN)

( * ) Notice: Subject to any disclaimer, the term of this patent is extended or adjusted under 35 U.S.C. 154(b) by 38 days.

(21) Appl. No.: 17/740,268

(22) Filed: May 9, 2022

(65) Prior Publication Data
US 2023/0325310 A1 Oct. 12, 2023

(30) Foreign Application Priority Data
Apr. 8, 2022 (CN) .......................... 202210367863.7

(51) Int. Cl.
*G06F 12/02* (2006.01)
*G06F 1/20* (2006.01)

(52) U.S. Cl.
CPC .......... *G06F 12/0238* (2013.01); *G06F 1/206* (2013.01); *G06F 2212/2022* (2013.01)

(58) Field of Classification Search
None
See application file for complete search history.

(56) References Cited

U.S. PATENT DOCUMENTS

| | | | |
|---|---|---|---|
| 8,122,187 B2* | 2/2012 | Walker | G11C 11/406 711/106 |
| 8,429,436 B2* | 4/2013 | Fillingim | G06F 11/3034 713/320 |
| 11,709,627 B2* | 7/2023 | Fujimori | G06F 3/061 711/103 |
| 2010/0023678 A1* | 1/2010 | Nakanishi | G11C 16/102 327/512 |

(Continued)

FOREIGN PATENT DOCUMENTS

| | | | | |
|---|---|---|---|---|
| TW | 201314455 | | 4/2013 | |
| TW | 202228127 A | * | 7/2022 | ............ G06F 11/002 |

OTHER PUBLICATIONS

"Office Action of Taiwan Counterpart Application", dated Jul. 27, 2023, p. 1-p. 10.

*Primary Examiner* — Charles Rones
*Assistant Examiner* — Ryan Dare
(74) *Attorney, Agent, or Firm* — JCIPRNET

(57) ABSTRACT

A memory adaptive temperature controlling method, a storage device, and a control circuit unit are provided. In this exemplary embodiment, the temperature value is obtained according to the temperature measured by the thermal sensor, and the access speed to be reached is calculated according to the temperature change rate within the specific time range and the adjustment percentage when it is determined that the speed-down or speed-up operation is required to be performed. By adjusting the access speed of the memory storage device in a stepwise manner, the temperature of the memory storage device may be stabilized, thereby striking the balance between the temperature stability and the system performance of the memory storage device.

18 Claims, 7 Drawing Sheets

(56) References Cited

U.S. PATENT DOCUMENTS

| | | | |
|---|---|---|---|
| 2012/0066439 A1* | 3/2012 | Fillingim | G06F 3/0653 |
| | | | 711/E12.008 |
| 2014/0025882 A1* | 1/2014 | Kuramoto | G06F 16/90339 |
| | | | 711/108 |
| 2020/0159442 A1 | 5/2020 | Shida | |
| 2023/0236738 A1* | 7/2023 | Huang | G06F 3/0659 |
| | | | 711/154 |

* cited by examiner

MEMORY ADAPTIVE TEMPERATURE CONTROLLING METHOD, STORAGE DEVICE AND CONTROL CIRCUIT UNIT

CROSS-REFERENCE TO RELATED APPLICATION

This application claims the priority benefit of China application serial no. 202210367863.7, filed on Apr. 8, 2022. The entirety of the above-mentioned patent application is hereby incorporated by reference herein and made a part of this specification.

BACKGROUND

Technical Field

The disclosure relates to a memory temperature control technology, and more particularly, to a memory adaptive temperature controlling method, a storage device, and a control circuit unit.

Description of Related Art

The rapid growth of digital cameras, cell phones, and MP3 over the past few years has resulted in a rapid increase in consumer demand for storage media. Since a rewritable non-volatile memory has the characteristics such as non-volatile data, power saving, small size, no mechanical structure, fast read and write speed, it is most suitable for portable electronic products, such as notebook computers. A solid state drive is a memory storage device that uses a flash memory module as a storage medium. Therefore, in recent years, the flash memory industry has become a very popular part of the electronic industry.

The memory storage device generates a lot of heat energy during operation. In order to avoid impact on the performance or damage of the device due to overheating, the temperature of the memory storage device must generally be suppressed below a certain temperature. In the conventional technology, when the temperature of the device reaches a temperature threshold value that may affect the operation, the memory storage device starts a speed-down operation to reduce the temperature. The speed-down operation may be used to reduce the temperature of the device. When the temperature has dropped to a reasonable temperature, the memory storage device stops performing the speed-down operation. FIG. 1 is a schematic diagram of a conventional temperature value affected by a speed-down operation. In FIG. 1, assuming that the temperature rises to a threshold value TH1 at a time point T1, the memory storage device performs the speed-down operation. After the speed-down operation is performed, if the temperature drops to a threshold value TH2 at a time point T2, the memory storage device stops performing the speed-down operation. Next, assuming that the temperature rises to the threshold value TH1 again at a time point T3, the memory storage device may perform the speed-down operation again. If the temperature drops to the threshold value TH2 at a time point T4, the memory storage device stops the speed-down operation. Repeatedly performing and stopping the speed-down operation in this way causes the temperature of the device to fluctuate too much.

SUMMARY

The disclosure provides a memory adaptive temperature controlling method, a storage device, and a control circuit unit, which may improve a temperature control mechanism of a memory storage device, thereby striking a balance between temperature stability and system performance of the memory storage device.

The disclosure provides a memory adaptive temperature controlling method for a memory storage device including a memory control circuit unit and a rewritable non-volatile memory module. The memory control circuit unit is configured to control the rewritable non-volatile memory module. The method includes the following. A temperature is measured through a thermal sensor to obtain a first temperature value, and it is determined whether the first temperature value is greater than a first threshold value. In response to determining that the first temperature value is greater than the first threshold value, a speed-down operation is performed to reduce an access speed of the memory storage device to a first speed. When the memory storage device performs data access at the first speed, the temperature is measured through the thermal sensor to obtain a second temperature value, and it is determined whether the second temperature value is less than a second threshold value. In response to determining that the second temperature value is less than the second threshold value, a first temperature change rate within a specific time range is calculated, and a first adjustment percentage is determined according to the first temperature change rate. A second speed is calculated according to the first speed and the first adjustment percentage, and the access speed of the memory storage device is adjusted to the second speed.

In an embodiment of the disclosure, the second speed is less than the first speed.

In an embodiment of the disclosure, calculating the first temperature change rate includes the following. The first temperature change rate between a time point when the first temperature value is determined to be greater than the first threshold value and a time point when the second temperature value is determined to be less than the second threshold value is calculated.

In an embodiment of the disclosure, determining the first adjustment percentage according to the first temperature change rate includes the following. A first look-up table is queried according to the first temperature change rate to obtain the first adjustment percentage.

In an embodiment of the disclosure, the method further includes the following. When the memory storage device performs the data access at the second speed, a second temperature change rate within the preset time interval is calculated after every preset time interval. A second adjustment percentage is determined according to the second temperature change rate. A third speed is calculated according to the second speed and the second adjustment percentage, and the access speed of the memory storage device is adjusted to the third speed.

In an embodiment of the disclosure, adjusting the access speed of the memory storage device to the third speed includes the following. It is determined whether a temperature change within the preset time interval is a rise or a decrease. In response to determining that the temperature change is the rise, the speed-down operation is performed to adjust the access speed of the memory storage device to the third speed. In response to determining that the temperature change is the decrease, a speed-up operation is performed to adjust the access speed of the memory storage device to the third speed.

The disclosure provides a memory storage device including a connection interface unit, a rewritable non-volatile memory module, a thermal sensor, and a memory control circuit unit. The connection interface unit is configured to be coupled to a host system. The memory control circuit unit is coupled to the connection interface unit, the rewritable non-volatile memory module, and the thermal sensor. The memory control circuit unit is configured to measure a temperature through the thermal sensor to obtain a first temperature value, and determine whether the first temperature value is greater than a first threshold value. The memory control circuit unit is further configured to, in response to determining that the first temperature value is greater than the first threshold value, perform a speed-down operation to reduce an access speed of the memory storage device to a first speed. The memory control circuit unit is further configured to, when the memory storage device performs data access at the first speed, measure the temperature through the thermal sensor to obtain a second temperature value, and determine whether the second temperature value is less than a second threshold value. The memory control circuit unit is further configured to, in response to determining that the second temperature value is less than the second threshold value, calculate a first temperature change rate within a specific time range, and determine a first adjustment percentage according to the first temperature change rate. In addition, the memory control circuit unit is further configured to calculate a second speed according to the first speed and the first adjustment percentage, and adjust the access speed of the memory storage device to the second speed.

In an embodiment of the disclosure, the second speed is less than the first speed.

In an embodiment of the disclosure, an operation of calculating the first temperature change rate includes the following. The first temperature change rate between a time point when the first temperature value is determined to be greater than the first threshold value and a time point when the second temperature value is determined to be less than the second threshold value is calculated.

In an embodiment of the disclosure, an operation of determining the first adjustment percentage according to the first temperature change rate includes the following. A first look-up table is queried according to the first temperature change rate to obtain the first adjustment percentage.

In an embodiment of the disclosure, the memory control circuit unit is further configured to calculate a second temperature change rate within the preset time interval after every preset time interval when the memory storage device performs the data access at the second speed. The memory control circuit unit is further configured to determine a second adjustment percentage according to the second temperature change rate. In addition, the memory control circuit unit is further configured to calculate a third speed according to the second speed and the second adjustment percentage, and adjust the access speed of the memory storage device to the third speed.

In an embodiment of the disclosure, an operation of adjusting the access speed of the memory storage device to the third speed includes the following. It is determined whether a temperature change within the preset time interval is a rise or a decrease. In response to determining that the temperature change is the rise, the speed-down operation is performed to adjust the access speed of the memory storage device to the third speed. In response to determining that the temperature change is the decrease, a speed-up operation is performed to adjust the access speed of the memory storage device to the third speed.

The disclosure provides a memory control circuit unit configured to control a rewritable non-volatile memory module included in a memory storage device. The memory control circuit unit includes a host interface, a memory interface, a thermal sensor, and a memory management circuit. The host interface is configured to be coupled to a host system. The memory interface is configured to be coupled to the rewritable non-volatile memory module. The memory management circuit is coupled to the host interface, the memory interface, and the thermal sensor. The memory management circuit is configured to measure a temperature through the thermal sensor to obtain a first temperature value, and determine whether the first temperature value is greater than a first threshold value. The memory management circuit is further configured to, in response to determining that the first temperature value is greater than the first threshold value, perform a speed-down operation to reduce an access speed of the memory storage device to a first speed. The memory management circuit is further configured to, when the memory storage device performs data access at the first speed, measure the temperature through the thermal sensor to obtain a second temperature value, and determine whether the second temperature value is less than a second threshold value. The memory management circuit is further configured to, in response to determining that the second temperature value is less than the second threshold value, calculate a first temperature change rate within a specific time range, and determine a first adjustment percentage according to the first temperature change rate. In addition, the memory management circuit is further configured to calculate a second speed according to the first speed and the first adjustment percentage, and adjust the access speed of the memory storage device to the second speed.

In an embodiment of the disclosure, the second speed is less than the first speed.

In an embodiment of the disclosure, an operation of calculating the first temperature change rate includes the following. The first temperature change rate between a time point when the first temperature value is determined to be greater than the first threshold value and a time point when the second temperature value is determined to be less than the second threshold value is calculated.

In an embodiment of the disclosure, an operation of determining the first adjustment percentage according to the first temperature change rate includes the following. A first look-up table is queried according to the first temperature change rate to obtain the first adjustment percentage.

In an embodiment of the disclosure, the memory management circuit is further configured to calculate a second temperature change rate within the preset time interval after every preset time interval when the memory storage device performs the data access at the second speed. The memory management circuit is further configured to determine a second adjustment percentage according to the second temperature change rate. In addition, the memory management circuit is further configured to calculate a third speed according to the second speed and the second adjustment percentage, and adjust the access speed of the memory storage device to the third speed.

In an embodiment of the disclosure, an operation of adjusting the access speed of the memory storage device to the third speed includes the following. It is determined whether a temperature change within the preset time interval is a rise or a decrease. In response to determining that the temperature change is the rise, the speed-down operation is performed to adjust the access speed of the memory storage device to the third speed. In response to determining that the temperature change is the decrease, a speed-up operation is performed to adjust the access speed of the memory storage device to the third speed.

Based on the above, in this exemplary embodiment, the temperature value is obtained according to the temperature measured by the thermal sensor, and the access speed to be reached is calculated according to the temperature change rate within the specific time range and the adjustment percentage when it is determined that the speed-down or speed-up operation is required to be performed. By adjusting the access speed of the memory storage device in a stepwise manner, the temperature of the memory storage device may be stabilized, thereby striking the balance between the temperature stability and the system performance of the memory storage device. Compared with the conventional cooling mechanism that performs or stops performing the speed-down operation at a specific threshold value, the disclosure may control the temperature of the memory storage device more flexibly.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
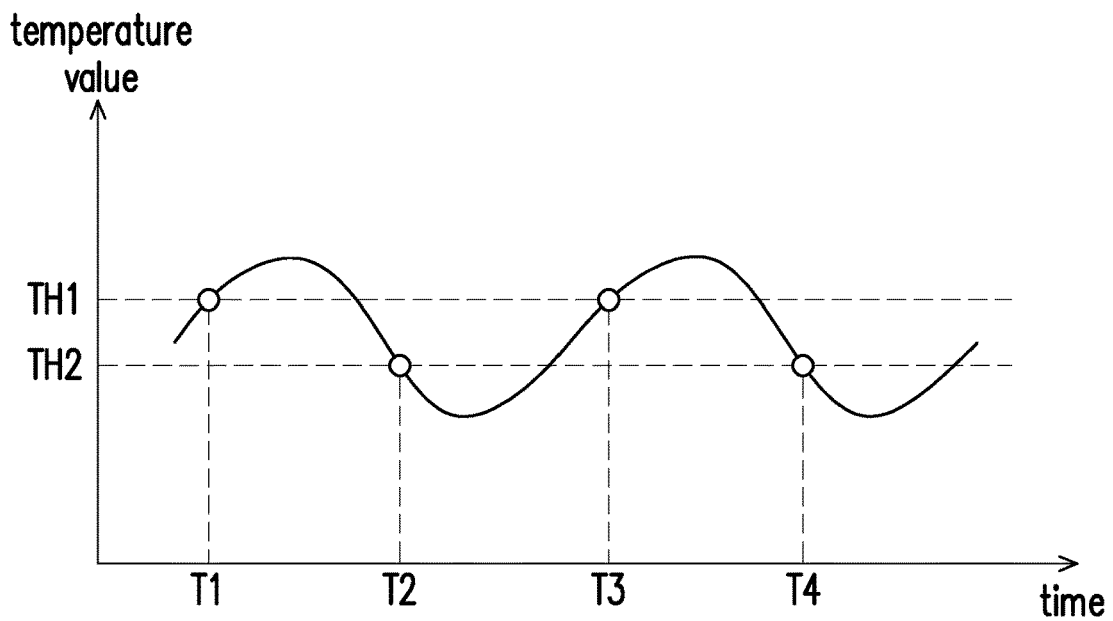
FIG. 1 is a schematic diagram of a conventional temperature value affected by a speed-down operation.

The terms "first", "second", and the like as mentioned throughout the present specification (including the claims) are used to name the elements or to distinguish between different embodiments or scopes, rather than setting an upper or lower limit on the number of the elements or the order of the elements. In addition, wherever possible, elements/components/steps with the same reference numerals in the drawings and embodiments represent the same or similar parts. Cross-reference may be made between the elements/components/steps in different embodiments that are denoted by the same reference numerals or that have the same names. These embodiments are only a part of the disclosure, and do not disclose all possible implementations of the disclosure.

Generally, a memory storage device (also referred to as a memory storage system) includes a rewritable non-volatile memory module and a controller (also referred to as a control circuit unit). The memory storage device is usually used together with a host system, so that the host system may write data to the memory storage device or read data from the memory storage device.

Figure 2:
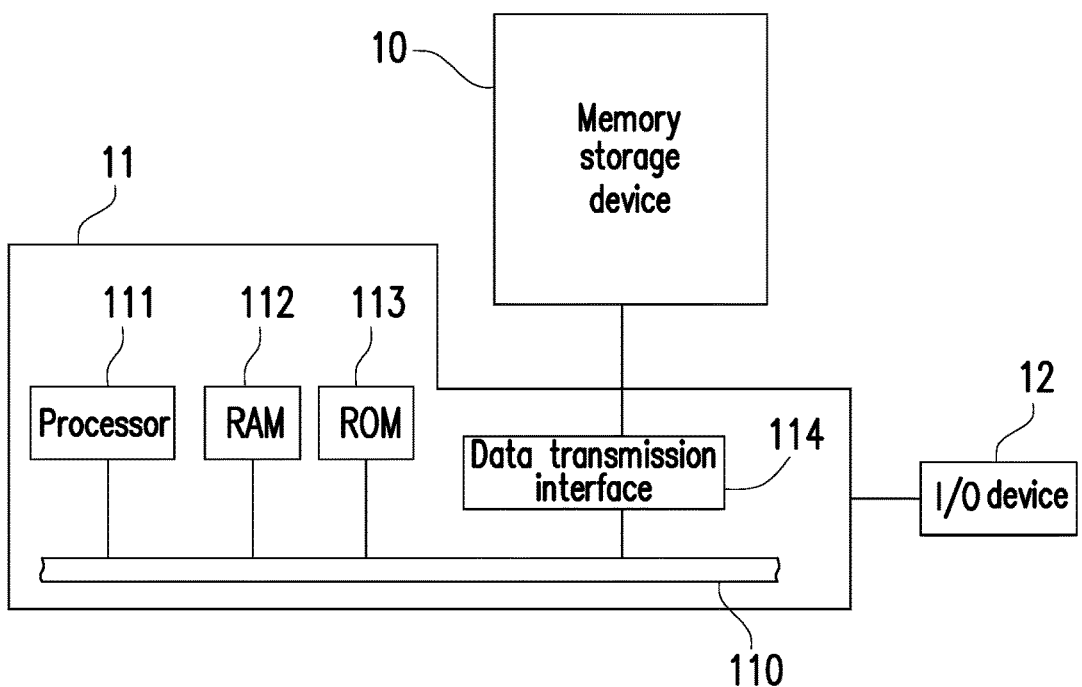
FIG. 2 is a schematic diagram of a host system, a memory storage device, and an input/output (I/O) device according to an exemplary embodiment.
Figure 3:
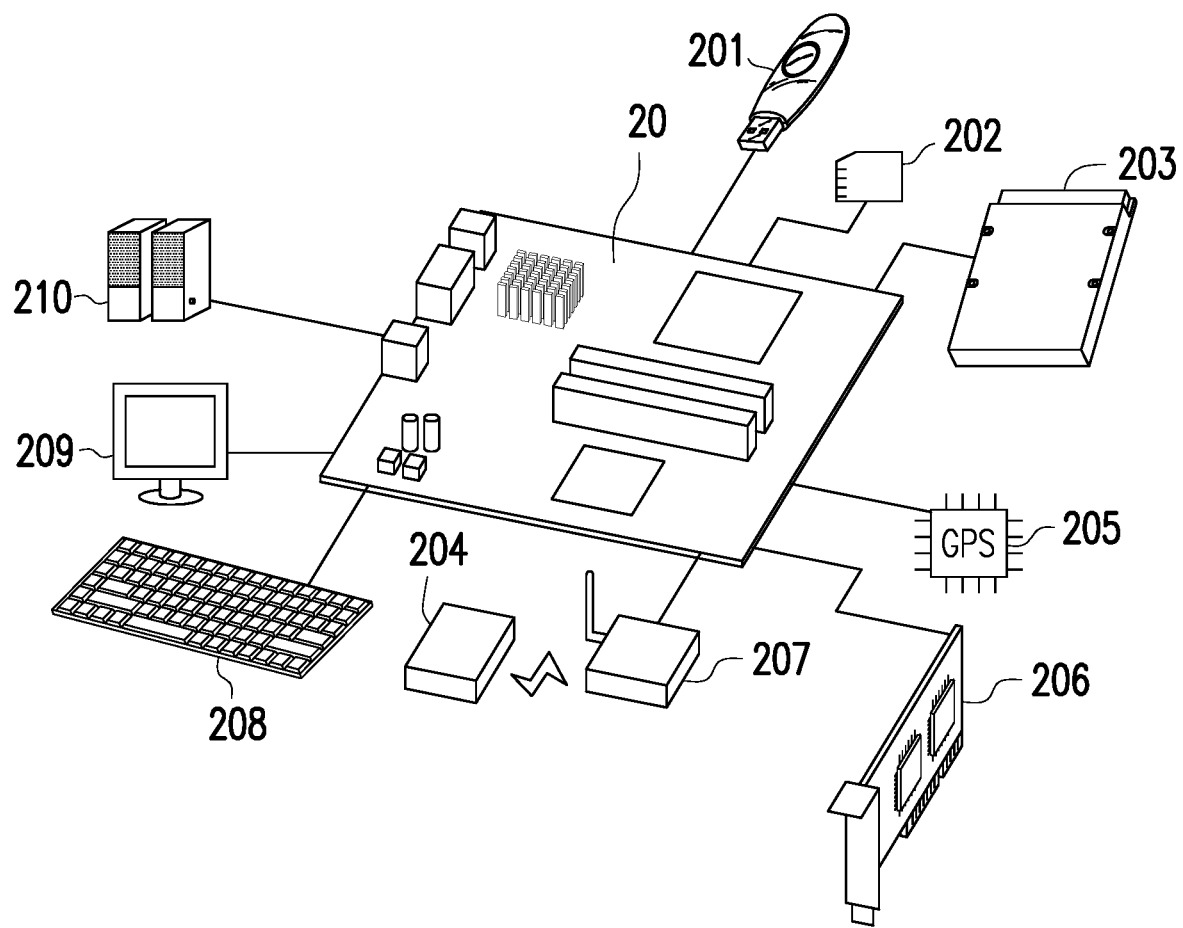
FIG. 3 is a schematic diagram of a host system, a memory storage device, and an input/output (I/O) device according to another exemplary embodiment.

FIG. 2 is a schematic diagram of a host system, a memory storage device, and an input/output (I/O) device according to an exemplary embodiment. FIG. 3 is a schematic diagram of a host system, a memory storage device, and an input/output (I/O) device according to another exemplary embodiment.

Referring to FIGS. 2 and 3, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In this exemplary embodiment, the host system 11 is coupled to a memory storage device 10 through the data transmission interface 114. For example, the host system 11 may write the data to the memory storage device 10 or read the data from the memory storage device through the data transmission interface 114. In addition, the host system 11 is coupled to an I/O device 12 through the system bus 110. For example, the host system 11 may transmit an output signal to the I/O device 12 or receive an input signal from the I/O device 12 through the system bus 110.

In this exemplary embodiment, the processor 111, the random access memory 112, the read only memory 113, and the data transmission interface 114 may be disposed on a motherboard 20 of the host system 11. The number of data transmission interfaces 114 may be one or more. Through the data transmission interface 114, the motherboard 20 may be coupled to the memory storage device 10 in a wire or wireless manner. The memory storage device 10 may be, for example, a flash drive 201, a memory card 202, a solid state drive (SSD) 203, or a wireless memory storage device 204. The wireless memory storage device 204 may be, for example, memory storage devices based on various wireless communication technologies, such as a near field communication storage (NFC) memory storage device, a WiFi memory storage device, a Bluetooth memory storage device, or a low-power Bluetooth memory storage device (e.g., iBeacon). In addition, the motherboard 20 may be coupled to various I/O devices, such as a global positioning system (GPS) module 205, a network interface card 206, a wireless transmission device 207, a keyboard 208, a screen 209, a speaker 210, through the system bus 110. For example, in an exemplary embodiment, the motherboard 20 may access the wireless memory storage device 204 through the wireless transmission device 207.

Figure 4:
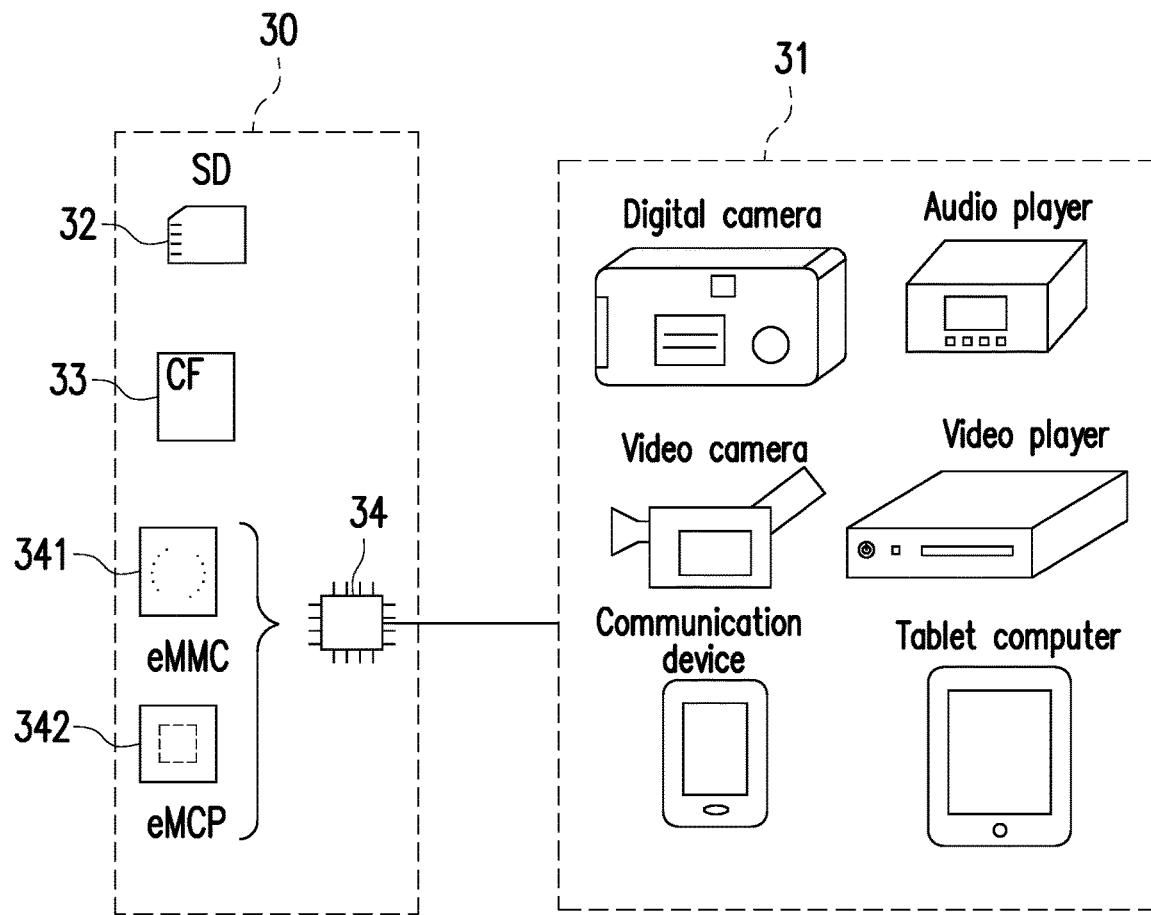
FIG. 4 is a schematic diagram of a host system and a memory storage device according to another exemplary embodiment.

In an exemplary embodiment, the mentioned host system is any system that may substantially cooperate with the memory storage device to store the data. In the above exemplary embodiment, the host system is described as a computer system. However, FIG. 4 is a schematic diagram of a host system and a memory storage device according to another exemplary embodiment. Referring to FIG. 4, in another exemplary embodiment, a host system 31 may also a system such as a digital camera, a video camera, a communication device, an audio player, a video player, or a tablet computer, while a memory storage device 30 may be various non-volatile memory storage devices such as an SD card 32, a CF card 33, or an embedded storage device 34 used by the host system 31. The embedded storage device 34 includes various types of embedded storage devices that directly couple a memory module to a substrate of the host system, such as an embedded MMC (eMMC) 341 and/or an embedded multi chip package (eMCP) 342.

Figure 5:
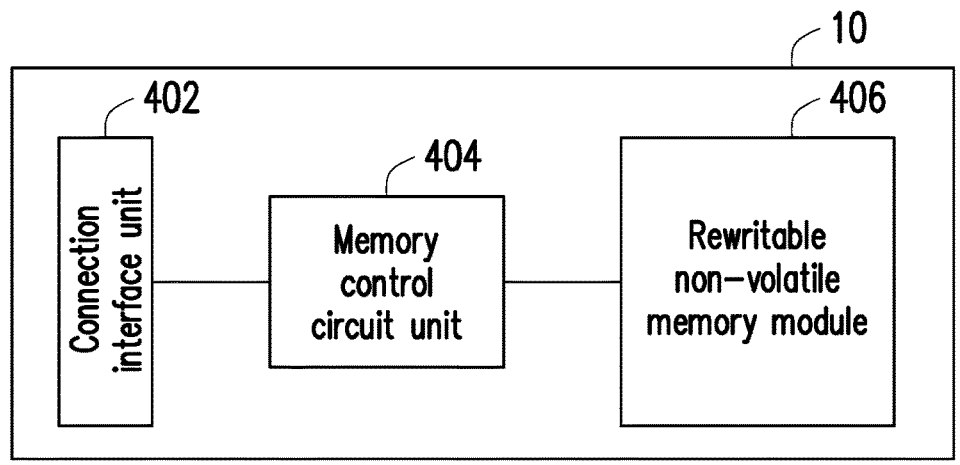
FIG. 5 is a schematic block diagram of a memory storage device according to an exemplary embodiment of the disclosure.

FIG. 5 is a schematic block diagram of a memory storage device according to an exemplary embodiment of the disclosure. Referring to FIG. 5, the memory storage device 10 includes a connection interface unit 402, a memory control circuit unit 404, and a rewritable non-volatile memory module 406.

The connection interface unit 402 is configured to couple the memory storage device to the host system 11. The memory storage device 10 may communicate with the host system 11 through the connection interface unit 402. In this exemplary embodiment, the connection interface unit 402 is compatible with a Serial Advanced Technology Attachment (SATA) standard. However, it should be understood that the disclosure is not limited thereto. The connection interface unit 402 may also conform to a Parallel Advanced Technology Attachment (PATA) standard, an Institute of Electrical and Electronic Engineers (IEEE) 1394 standard, a Peripheral Component Interconnect Express (PCI Express) standard, a Universal Serial Bus (USB) standard, an SD interface standard, an Ultra High Speed-I (UHS-I) interface standard, an Ultra High Speed-II (UHS-II) interface standard, a Memory Stick (MS) interface standard, an MCP interface standard, an MMC interface standard, an eMMC interface standard, a Universal Flash Storage (UFS) interface standard, an eMCP interface standard, a CF interface standard, an Integrated Device Electronics (IDE) standard, or other suitable standards. The connection interface unit 402 may be packaged with the memory control circuit unit 404 in a chip, or the connection interface unit 402 may be arranged outside a chip including the memory control circuit unit 404.

The memory control circuit unit 404 is configured to execute multiple logic gates or control commands implemented in a form of hardware or firmware, and perform operations such as data writing, reading, and erasing in the rewritable non-volatile memory module 406 according to commands of the host system 11.

The rewritable non-volatile memory module 406 is coupled to the memory control circuit unit 404 and configured to store the data written by the host system 11. The rewritable non-volatile memory module 406 may be a single level cell (SLC) NAND flash memory module (i.e., a flash memory that may store 1 bit in a memory cell), a multi level cell (MLC) NAND flash memory module (i.e., a flash memory module that may store 2 bits in one memory cell), a triple level cell (TLC) NAND flash memory module (i.e., a flash memory module that may store 3 bits in one memory cell), a quad level cell (QLC) NAND flash memory module (i.e., a flash memory module that may store 4 bits in one memory cell), other flash memory modules, or other memory modules having the same characteristics.

Each of the memory cells in the rewritable non-volatile memory module 406 stores one or more bits by a change in a voltage (hereinafter also referred to as a threshold voltage). Specifically, there is a charge trapping layer between a control gate of each of the memory cells and a channel. By applying a write voltage to the control gate, the number of electrons of the charge trapping layer may be changed, thereby changing the threshold voltage of the memory cell. The operation of changing the threshold voltage of the memory cell is also referred to as "writing the data to the memory cell" or "programming the memory cell". As the threshold voltage changes, each of the memory cells in the rewritable non-volatile memory module 406 has multiple storage states. By applying a read voltage, it is possible to determine which storage state one memory cell belongs to, thereby obtaining the one or more bits stored in the memory cell.

In this exemplary embodiment, the memory cells of the rewritable non-volatile memory module 406 may constitute multiple physical programming units, and the physical programming units may constitute multiple physical erase units. Specifically, the memory cells on the same word line may form one or more physical programming units. If each of the memory cells may store more than 2 bits, the physical programming units on the same word line may be classified into at least a lower physical programming unit and an upper physical programming unit. For example, a least significant bit (LSB) of one memory cell belongs to the lower physical programming unit, and a most significant bit (MSB) of one memory cell belongs to the upper physical programming unit. Generally speaking, in an MLC NAND flash memory, a write speed of the lower physical programming unit is higher than a write speed of the upper physical programming unit, and/or the reliability of the lower physical programming unit is higher than the reliability of the upper physical programming unit.

In this exemplary embodiment, the physical programming units are the smallest units of programming. That is, the physical programming units are the smallest units for writing the data. For example, the physical programming units may be physical pages or physical sectors. If the physical programming units are the physical pages, the physical programming units may include a data bit area and a redundancy bit area. The data bit area includes multiple physical sectors to store user data, and the redundancy bit area is configured to store system data (e.g., management data such as error correction codes). In this exemplary embodiment, the data byte area includes 32 physical sectors, and a size of one physical sector is 512 bytes (B). However, in other exemplary embodiments, the data bit area may also include 8, 16, or more, or less physical sectors, and the size of each of the physical sectors may also be larger or smaller. On the other hand, the physical erase units are the smallest units of erasing. That is, each of the physical erase units includes a minimum number of memory cells that are erased. For example, the physical erase units are physical blocks.

Figure 6:
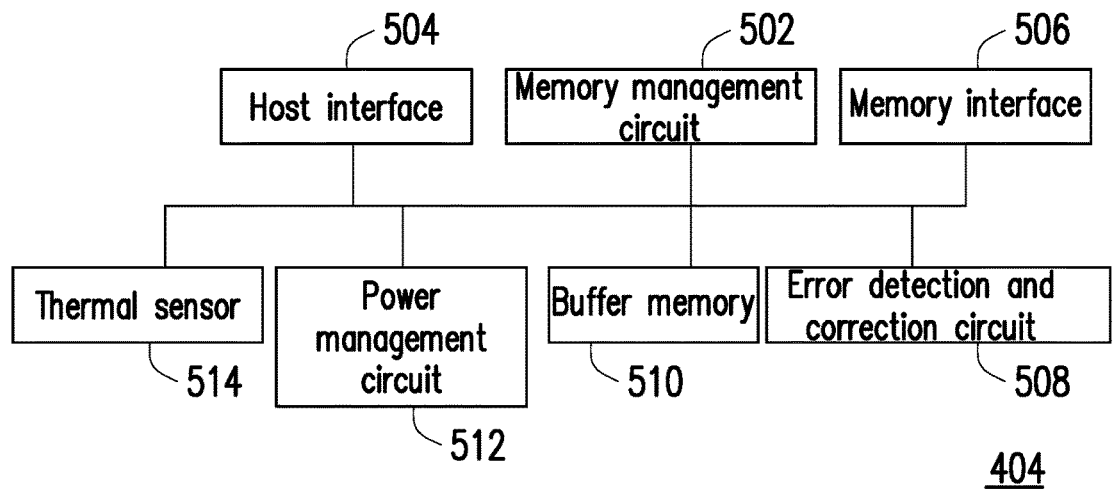
FIG. 6 is a schematic block diagram of a memory control circuit unit according to an exemplary embodiment of the disclosure.

FIG. 6 is a schematic block diagram of a memory control circuit unit according to an exemplary embodiment of the disclosure. Referring to FIG. 6, the memory control circuit unit 404 includes a memory management circuit 502, a host interface 504, and a memory interface 506.

The memory management circuit 502 is configured to control an overall operation of the memory control circuit unit 404. Specifically, the memory management circuit 502 has multiple control commands, and when the memory storage device 10 operates, the control commands are executed to perform the operations such as data writing, reading, and erasing. The following description of an operation of the memory management circuit 502 is equivalent to the description of the operation of the memory control circuit unit 404.

In this exemplary embodiment, the control commands of the memory management circuit 502 are implemented in the form of firmware. For example, the memory management circuit 502 has a microprocessor unit (not shown) and a read only memory (not shown), and the control commands are programmed into the read only memory. When the memory storage device 10 operates, the control commands are executed by the microprocessor unit to perform the operations such as data writing, reading, and erasing.

In another exemplary embodiment, the control commands of the memory management circuit 502 may also be stored in a specific area (e.g., a system area dedicated to storing the system data in the memory module) of the rewritable non-volatile memory module 406 in a form of program code. In addition, the memory management circuit 502 has the microprocessor unit (not shown), the read only memory (not shown), and a random access memory (not shown). In particular, the read only memory has a boot code, and when the memory control circuit unit 404 is enabled, the microprocessor unit first executes the boot code to load the control commands stored in the rewritable non-volatile memory module 406 into the random access memory of the memory management circuit 502. Afterwards, the microprocessor unit runs the control commands to perform the operations such as data writing, reading, and erasing.

In addition, in another exemplary embodiment, the control commands of the memory management circuit 502 may also be implemented in the form of hardware. For example, the memory management circuit 502 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage memory cells or memory cell groups of the rewritable non-volatile memory module 406. The memory write circuit is configured to issue a write command sequence to the rewritable non-volatile memory module 406, so as to write the data into the rewritable non-volatile memory module 406. The memory read circuit is configured to issue a read command sequence to the rewritable non-volatile memory module 406, so as to read the data from the rewritable non-volatile memory module 406. The memory erase circuit is configured to issue an erase command sequence to the rewritable non-volatile memory module 406, so as to erase the data from the rewritable non-volatile memory module 406. The data processing circuit is configured to process the data to be written into the rewritable non-volatile memory module 406 and the data read from the rewritable non-volatile memory module 406. The write command sequence, the read command sequence, and the erase command sequence may each include one or more program codes or command codes, and are configured to instruct the rewritable non-volatile memory module 406 to perform corresponding operations such as writing, reading, and erasing. In an exemplary embodiment, the memory management circuit 502 may further issue other types of command sequences to the rewritable non-volatile memory module 406, so as to instruct the corresponding operations to be performed.

The host interface 504 is coupled to the memory management circuit 502. The memory management circuit 502 may communicate with the host system 11 through the host interface 504. The host interface 504 may be configured to receive and identify the commands and the data transmitted by the host system 11. For example, the commands and the data transmitted by the host system 11 may be transmitted to the memory management circuit 502 through the host interface 504. In addition, the memory management circuit 502 may transmit the data to the host system 11 through the host interface 504. In this exemplary embodiment, the host interface 504 is compatible with the SATA standard. However, it should be understood that the disclosure is not limited thereto. The host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and configured to access the rewritable non-volatile memory module 406. That is, the data to be written to the rewritable non-volatile memory module 406 is converted into a format acceptable to the rewritable non-volatile memory module 406 through the memory interface 506. Specifically, if the memory management circuit 502 is about to access the rewritable non-volatile memory module 406, the memory interface 506 will transmit the corresponding command sequence. For example, the command sequences may include the write command sequence to instruct to write the data, the read command sequence to instruct to read the data, the erase command sequence to instruct to erase the data, and the corresponding command sequences to instruct various memory operations (e.g., operations such as changing a read voltage level or performing garbage collection). The command sequences are, for example, generated by the memory management circuit 502 and transmitted to the rewritable non-volatile memory module 406 through the memory interface 506. The command sequences may include one or more signals or data on the bus. The signals or the data may include the command codes or the program codes. For example, in the read command sequence, information such as a read identification code and a memory address is included.

In an exemplary embodiment, the memory control circuit unit 404 further includes an error detection and calibration circuit 508, a buffer memory 510, a power management circuit 512, and a thermal sensor 514.

The error detection and calibration circuit 508 is coupled to the memory management circuit 502 and configured to perform error detection and calibration operations to ensure correctness of the data. Specifically, when the memory management circuit 502 receives a write command from the host system 11, the error detection and calibration circuit 508 generates a corresponding error correcting code (ECC) and/or error detecting code (EDC) for the data corresponding to the write command, and the memory management circuit 502 writes the data corresponding to the write command and the corresponding error correcting code and/or error detecting code to the rewritable non-volatile memory module 406. Afterwards, when the memory management circuit 502 reads the data from the rewritable non-volatile memory module 406, the memory management circuit 502 also reads the error correcting code and/or error detecting code corresponding to the data, and the error detection and calibration circuit 508 performs the error detection and calibration operations on the read data according to the error correcting code and/or error detecting code.

The buffer memory 510 is coupled to the memory management circuit 502 and configured to temporarily store the data and the commands from the host system 11 or the data from the rewritable non-volatile memory module 406. The power management circuit 512 is coupled to the memory management circuit 502 and configured to control power of the memory storage device 10.

The thermal sensor 514 is coupled to the memory management circuit 502 and configured to sense a temperature.

The thermal sensor 514 is, for example, a thermocouple thermal sensor, a resistance thermal sensor, a thermistor thermal sensor, a semiconductor thermal sensor, or other similar types of thermal sensors. In this exemplary embodiment, the thermal sensor 514 may measure a temperature of the memory control circuit unit 404 and/or a temperature of the rewritable non-volatile memory module 406. The thermal sensor 514 may be disposed inside the memory control circuit unit 404, outside the memory control circuit unit 404, inside the rewritable non-volatile memory module 406, outside the rewritable non-volatile memory module 406, or at other positions suitable for measuring the temperature, and the disclosure is not limited thereto. In addition, the number of thermal sensors 514 may be one or more.

In an exemplary embodiment, the rewritable non-volatile memory module 406 in FIG. is also referred to as a flash memory module, and the memory control circuit unit 404 is also referred to as a flash memory controller for controlling the flash memory module. In an exemplary embodiment, the memory management circuit 502 in FIG. 6 is also referred to as a flash memory management circuit.

Figure 7:
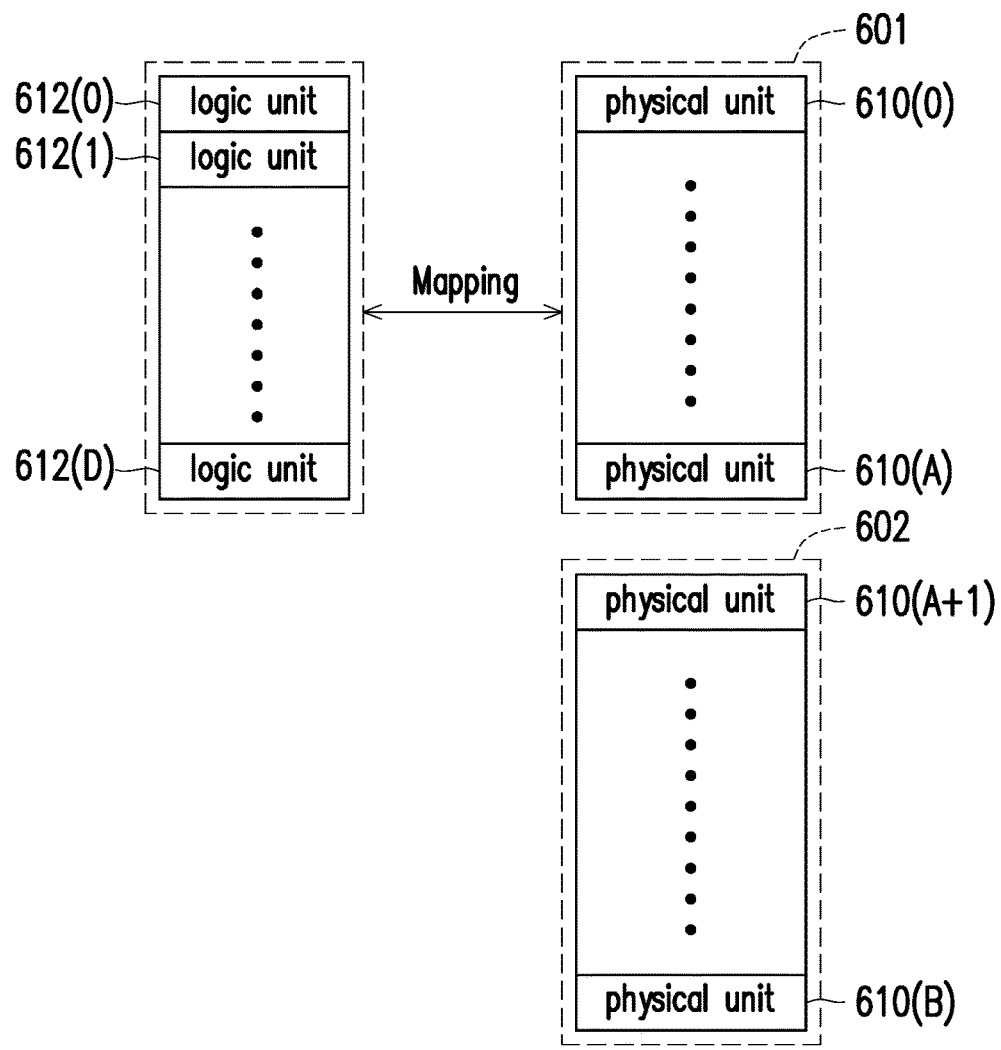
FIG. 7 is a schematic diagram of managing a rewritable non-volatile memory module according to an exemplary embodiment of the disclosure.

FIG. 7 is a schematic diagram of managing a rewritable non-volatile memory module according to an exemplary embodiment of the disclosure. Referring to FIG. 7, the memory management circuit 502 may logically group physical units 610(0) to 610(B) of the rewritable non-volatile memory module 406 into a storage area 601 and a replacement area 602. The physical units 610(0) to 610(A) in the storage area 601 are configured to store the data, while the physical units 610(A+1) to 610(B) in the replacement area 602 are configured to replace the damaged physical units in the storage area 601. For example, if the data read from the certain physical unit contains too many errors and may not be corrected, the physical unit is considered the damaged physical unit. It should be noted that if there is no available physical erase unit in the replacement area 602, the memory management circuit 502 may declare the entire memory storage device 10 to be in a write protect state, so that the data may not be written.

In this exemplary embodiment, each of the physical units refers to one physical erase unit. However, in another exemplary embodiment, the one physical unit may also refer to a physical address, a physical programming unit, or be formed by multiple continuous or discontinuous physical addresses. The memory management circuit 502 disposes logic units 612(0) to 612(C) to map the physical units 610(0) to 610(A) in the storage area 601. In this exemplary embodiment, each of the logic units refers to a logical address. However, in another exemplary embodiment, one logic unit may also refer to a logic programming unit, a logic erase unit, or is formed by multiple continuous or discontinuous logic addresses. In addition, each of the logic units 612(0) to 612(C) may be mapped to the one or more physical units.

The memory management circuit 502 may record a mapping relationship (also referred to as the logical-physical address mapping relationship) between the logic units and the physical units in at least one logical-physical address mapping table. When the host system 11 is about to read the data from the memory storage device 10 or write the data to the memory storage device 10, the memory management circuit 502 may perform a data access operation on the memory storage device 10 according to the logical-physical address mapping table.

In an exemplary embodiment, the memory management circuit 502 may measure a temperature of the memory storage device 10 through the thermal sensor 514 to obtain a temperature value. The temperature value changes with the temperature measured by the thermal sensor 514. The higher the temperature measured by the thermal sensor 514 is, the higher the temperature value is, while the lower the measured temperature is, the lower the temperature value is. Generally speaking, the temperature of the memory storage device 10 has to be controlled below a certain temperature, otherwise the memory storage device 10 may be damaged due to overheating. For example, an operating temperature range of the memory control circuit unit 404 and/or the rewritable non-volatile memory module 406 is between −25° C. and 80° C. However, the operating temperature range of each of the memory storage devices may vary according to characteristics thereof.

In this exemplary embodiment, if the current temperature value is too high, the memory storage device 10 may perform a speed-down operation to reduce an access speed of the memory storage device 10. The speed-down operation may be configured to reduce the temperature of the memory storage device 10. For example, the speed-down operation may include various speed-down means such as reducing a clock frequency of the memory storage device 10 and reducing the number of controlled rewritable non-volatile memory modules 406. In addition, if the thermal sensor 514 measures that the current temperature value has dropped to an appropriate temperature after the speed-down operation is performed, the memory management circuit 502 may perform a speed-up operation to increase the access speed of the memory storage device 10. The speed-up operation includes, for example, various speed-up means such as increasing the clock frequency of the memory storage device 10 and increasing the number of controlled rewritable non-volatile memory modules 406. However, the disclosure is not limited to the means of the speed-down operation and speed-up operation. The operation that may reduce the speed of the memory storage device 10 belongs to the scope of the speed-down operation in the disclosure, and the operation that may increase the speed of the memory storage device 10 belongs to the scope of the speed-up operation in the disclosure.

Figure 8:
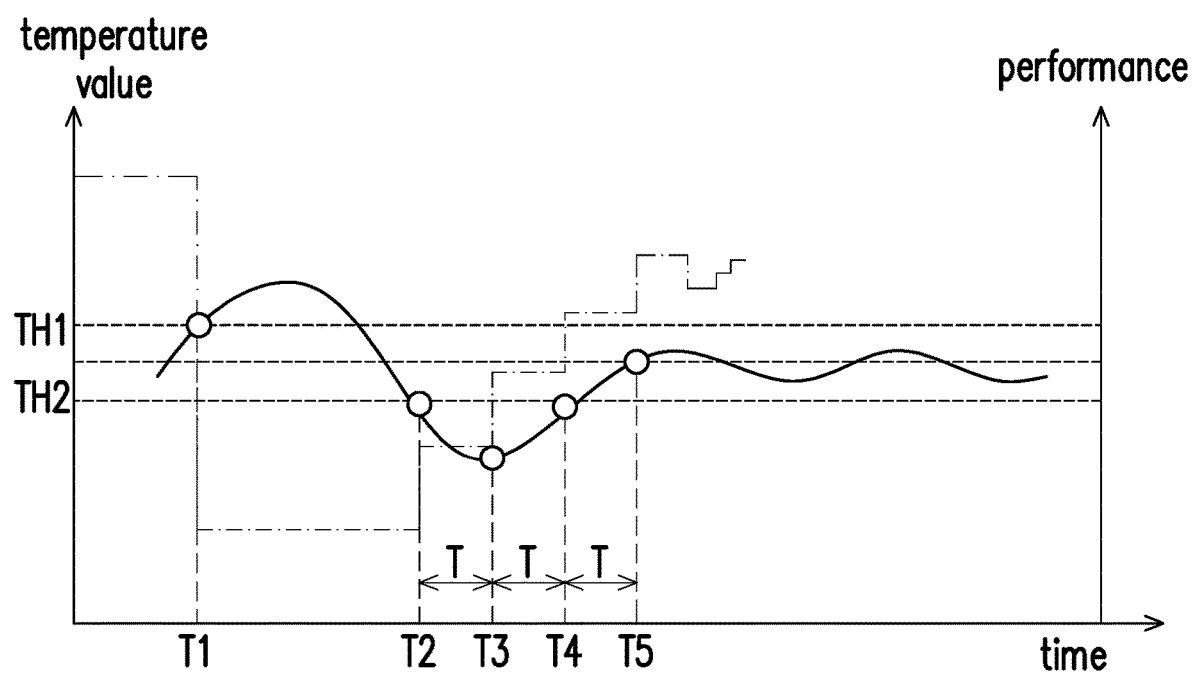
FIG. 8 is a schematic diagram of a temperature value affected by the speed-down operation according to an exemplary embodiment of the disclosure.

FIG. 8 is a schematic diagram of a temperature value affected by the speed-down operation according to an exemplary embodiment of the disclosure. Referring to FIG. 8, a solid line in FIG. 8 denotes a temperature value change, and a single-dot long dash line denotes a performance change. A threshold value TH1 (also referred to as a first threshold value) and a threshold value TH2 (also referred to as a second threshold value) may be determined. The threshold value TH1 is greater than the threshold value TH2. For example, the threshold value TH1 may be 75° C., and the threshold value TH2 may be 65° C. In this exemplary embodiment, the memory management circuit 502 determines whether the temperature value (also referred to as a first temperature value) is greater than the threshold value TH1. Assuming that at a time point T1, the memory management circuit 502 determines that the first temperature value is greater than the threshold value TH1, the memory management circuit 502 performs the speed-down operation to reduce the access speed of the memory storage device 10 to a first speed.

When the memory storage device 10 performs data access at the first speed, the memory management circuit 502 continuously measures the temperature through the thermal sensor 514 to obtain the temperature value (also referred to as a second temperature value). In addition, the memory management circuit 502 determines whether the second temperature value is less than the threshold value TH2. Assuming that at a time point T2, the memory management circuit 502 determines that the second temperature value is less than the threshold value TH2, the memory management circuit 502 calculates a temperature change rate (also referred to as a first temperature change rate) within a specific time range, and determines an adjustment percentage (also referred to as a first adjustment percentage) according to the temperature change rate within the specific time range.

In this exemplary embodiment, the memory management circuit 502 may calculate the first temperature change rate between the time point when the first temperature value is determined to be greater than the threshold value TH1 and the time point when the second temperature value is determined to be less than the threshold value TH2. For example, referring to FIG. 8, the memory management circuit 502 may calculate the temperature change rate within the time range from the time point T1 to the time point T2. For example, the temperature change rate between the time point T1 and the time point T2 may be calculated using the following Formula (1).

$$V1=(TH2-TH1)/(T2-T1) \quad (1)$$

In Formula (1), V1 denotes the temperature change rate; T1 denotes the time point when the temperature value is greater than the first threshold value, and T2 denotes the time point when the temperature value is less than the second threshold value. Next, the memory management circuit 502 may determine the adjustment percentage according to the temperature change rate V1.

In an exemplary embodiment, the temperature change rate and the adjustment percentage may be recorded in a speed adjustment look-up table (also referred to as a first look-up table), and the memory management circuit 502 may query the speed adjustment look-up table according to the temperature change rate to obtain the adjustment percentage. However, in other embodiments, the memory management circuit 502 may also calculate the adjustment percentage according to the temperature change rate and a preset formula, and the disclosure is not limited thereto.

Specifically, the memory management circuit 502 may establish the speed adjustment look-up table to record a corresponding relationship between the temperature change rate and the adjustment percentage. The corresponding relationship between the temperature change rate and the adjustment percentage may be generated through a series of prior tests and analyses, and stored in the memory storage device 10. Table 1 below is an example of the speed adjustment look-up table in an exemplary embodiment.

TABLE 1

| temperature change rate | adjustment percentage (%) |
|---|---|
| +M | −8 |
| +N | −10 |
| −M | +8 |
| −N | +10 |

According to Table 1, a unit of the temperature change rate is assumed to be Celsius temperature change per second (° C./s). A temperature change rate +M denotes that the temperature rises M ° C. per second. A temperature change rate +N denotes that the temperature rises N ° C. per second. A temperature change rate −M denotes that the temperature drops M° C. per second. A temperature change rate −N denotes that the temperature drops N° C. per second. It is worth noting that in this exemplary embodiment, N is greater than M, and an absolute value of the adjustment percentage corresponding to the temperature change rate ±N is greater than an absolute value of the adjustment percentage corresponding to the temperature change rate ±M, which indicates that the greater the temperature change rate, the higher a value of the required adjustment percentage. According to Table 1, the temperature change rate +M corresponds to an adjustment percentage −8. It indicates that if the temperature change rate is +M, the memory management circuit 502 reduces the access speed of the memory storage device 10 by 8%. Detailed descriptions of other fields in Table 1 may be adjusted according to the similar method. Therefore, the same details will not be repeated in the following.

Next, after determining the adjustment percentage, the memory management circuit 502 calculates a second speed according to the first speed and the adjustment percentage, and adjusts the access speed of the memory storage device 10 to the second speed. For example, the memory management circuit 502 may multiply the first speed by the adjustment percentage to obtain an adjustment value, and add the first speed and the adjustment value up to obtain the second speed. It should be noted that the disclosure is not limited to the method of calculating the second speed. Those skilled in the art may design a value for calculating the adjustment percentage of the second speed by themselves through the inspiration of the above exemplary embodiment, thereby obtaining the second speed through different calculation methods according to the designed adjustment percentage.

It should be noted that in an exemplary embodiment, the adjusted second speed is less than the first speed. With this limitation, it may be avoided that the temperature is likely to reach the threshold value TH1 again after the access speed is adjusted back to the first speed.

In an exemplary embodiment, when the memory storage device 10 performs the data access at the second speed, the memory management circuit 502 continuously measures the temperature through the thermal sensor 514 to obtain the temperature value. In addition, the memory management circuit 502 calculates the temperature change rate (also referred to as a second temperature change rate) within the preset time interval after every preset time interval. Next, the memory management circuit 502 determines the adjustment percentage (also referred to as a second adjustment percentage) according to the temperature change rate within the preset time interval. In this exemplary embodiment, the memory management circuit 502 may query the speed adjustment look-up table (e.g., Table 1 above) according to the temperature change rate to obtain the adjustment percentage, or may calculate the adjustment percentage according to the temperature change rate and the preset formula, and the disclosure is not limited thereto.

After determining the adjustment percentage, the memory management circuit 502 calculates a third speed according to the second speed and the adjustment percentage, and adjusts the access speed of the memory storage device 10 to the third speed. For example, the memory management circuit 502 may multiply the second speed by the adjustment percentage to obtain the adjustment value, and add the second speed and the adjustment value up to obtain the third speed. It should be noted that the disclosure is not limited to the method of calculating the third speed. Those skilled in the art may design a value for calculating the adjustment percentage of the third speed by themselves through the inspiration of the above exemplary embodiment, thereby obtaining the third speed through different calculation methods according to the designed adjustment percentage.

Specifically, the memory management circuit 502 may determine whether a temperature change of the temperature value continuously measured by the thermal sensor 514 within the preset time interval is a rise or a decrease. If the temperature change is a rise, the memory management circuit 502 performs the speed-down operation to adjust the access speed of the memory storage device 10 to the third speed. If the temperature change is a decrease, the memory management circuit 502 performs the speed-up operation to adjust the access speed of the memory storage device 10 to the third speed.

Referring to FIG. 8, assuming that the memory storage device 10 performs the data access at the second speed at the time point T2, the memory management circuit 502 may calculate the temperature change rate within the preset time interval T after every preset time interval T. For example, the memory management circuit 502 calculates the temperature change rate between the time point T2 and a time point T3 at the time point T3 after the preset time interval T of the time point T2, determines the adjustment percentage according to the temperature change rate, and then calculates the third speed according to the second speed and the adjustment percentage. In this exemplary embodiment, the temperature change of the temperature value between the time point T2 and the time point T3 is a decrease. Therefore, the memory management circuit 502 performs the speed-up operation to increase the access speed of the memory storage device 10 to the third speed.

Furthermore, the memory management circuit 502 calculates the temperature change rate between the time point T3 and a time point T4 at the time point T4 after the preset time interval T of the time point T3, and calculates a fourth speed according to the temperature change rate in the same manner as above. In this exemplary embodiment, the temperature change of the temperature value between the time point T3 and the time point T4 is a rise. Therefore, the memory management circuit 502 performs the speed-down operation to reduce the access speed of the memory storage device 10 to the fourth speed. The content of the time point T4 to a time point 15 is similar to that of the time point T3 to the time point T4. Therefore, the same details will not be repeated in the following.

Figure 9:
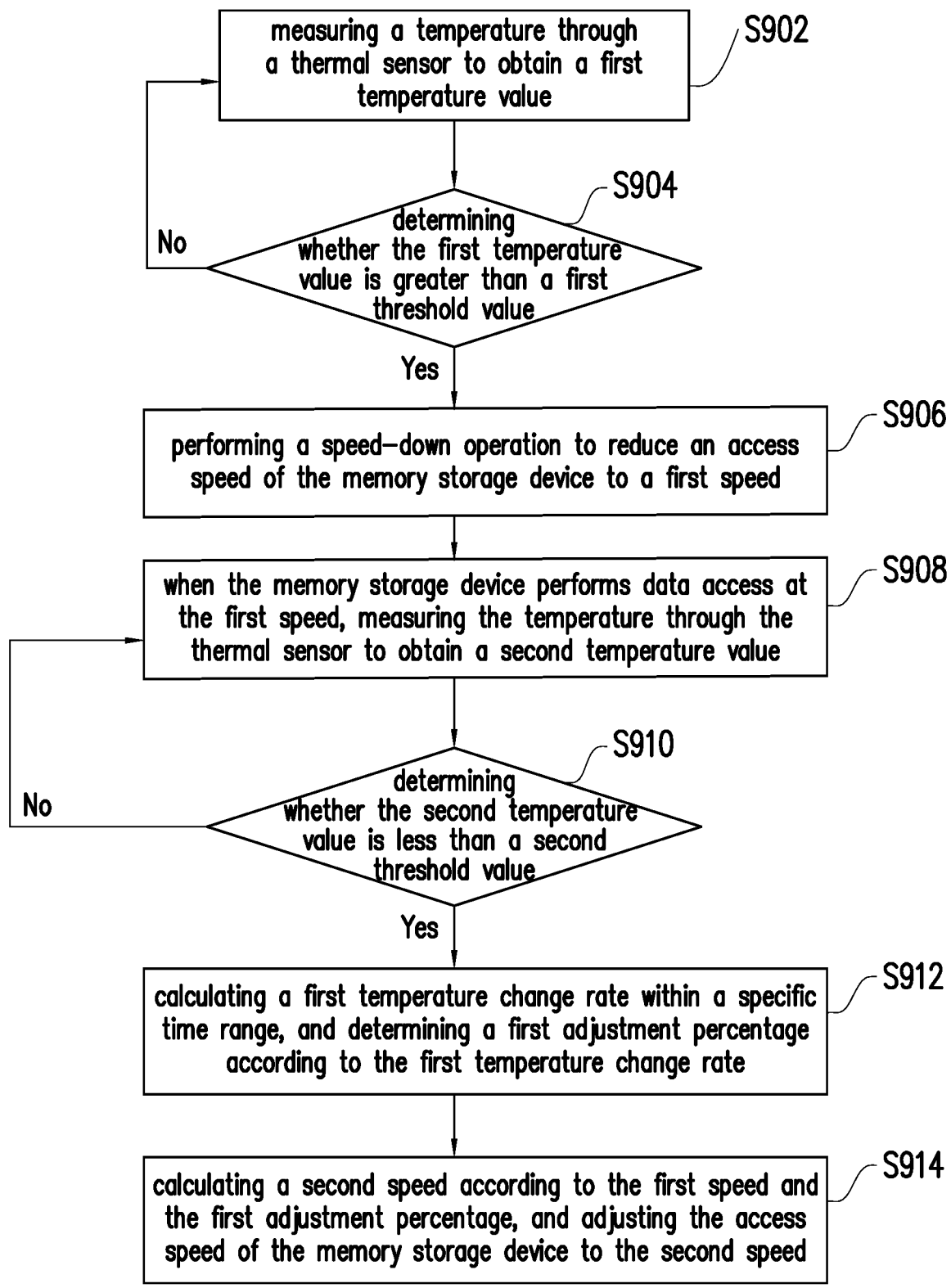
FIG. 9 is a flowchart of a memory adaptive temperature controlling method according to an exemplary embodiment of the disclosure.

FIG. 9 is a flowchart of a memory adaptive temperature controlling method according to an exemplary embodiment of the disclosure.

Referring to FIG. 9, in step S902, the temperature is measured through the thermal sensor to obtain the first temperature value. In step S904, it is determined whether the first temperature value is greater than the first threshold value. If it is determined that the first temperature value is greater than the first threshold value (that is, it is determined to be "Yes" in step S904), proceeding to step S906, the speed-down operation is performed to reduce the access speed of the memory storage device to the first speed. If it is determined that the first temperature value is not greater than the first threshold value (that is, it is determined to be "No" in step S904), the process proceeds to step S902. In step S908, when the memory storage device performs the data access at the first speed, the temperature is measured through the thermal sensor to obtain the second temperature value. In step S910, it is determined whether the second temperature value is less than the second threshold value. If it is determined that the second temperature value is less than the second threshold value (that is, it is determined to be "Yes" in step S910), proceeding to step S912, the first temperature change rate within the specific time range is calculated, and the first adjustment percentage is determined according to the first temperature change rate. If it is determined that the second temperature value is not less than the second threshold value (that is, it is determined to be "No" in step S910), the process proceeds to step S908. In step S914, the second speed is calculated according to the first speed and the first adjustment percentage, and the access speed of the memory storage device is adjusted to the second speed.

Figure 10:
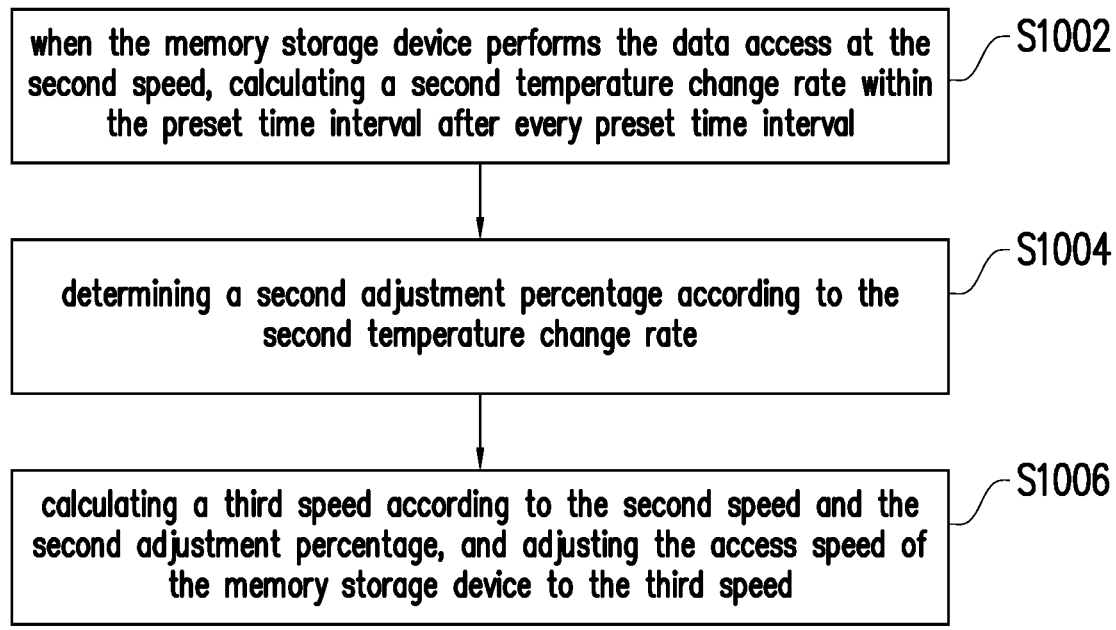
FIG. 10 is a flowchart of a memory adaptive temperature controlling method according to an exemplary embodiment of the disclosure.

FIG. 10 is a flowchart of a memory adaptive temperature controlling method according to an exemplary embodiment of the disclosure.

Referring to FIG. 10, in step S1002, when the memory storage device performs the data access at the second speed, the second temperature change rate within the preset time interval is calculated after every preset time interval. In step S1004, the second adjustment percentage is determined according to the second temperature change rate. In step S1006, the third speed is calculated according to the second speed and the second adjustment percentage, and the access speed of the memory storage device is adjusted to the third speed.

However, each of the steps in FIGS. 9 and 10 have been described in detail as above, and the same details will not be repeated in the following. It is worth noting that each of the steps in FIGS. 9 and 10 may be implemented as multiple program codes or circuits, and the disclosure is not limited thereto. In addition, the methods of FIGS. 9 and 10 may be used with the above exemplary embodiments, or may be used alone, and the disclosure is not limited thereto.

Based on the above, in the memory adaptive temperature controlling method, the storage device, and the control circuit unit according to the exemplary embodiments of the disclosure, when it is determined that the speed-down or speed-up operation is required to be performed, the access speed to be reached is calculated according to the temperature change rate within the specific time range and the adjustment percentage, so that the temperature change of the memory storage device is not too large. In addition, by adjusting the access speed of the memory storage device in a stepwise manner, in the exemplary embodiments, the temperature of the memory storage device may be stabilized while maintaining a certain system performance, thereby striking a balance between the temperature stability and the system performance of the memory storage device.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A memory adaptive temperature controlling method for a memory storage device comprising a memory control circuit unit and a rewritable non-volatile memory module, wherein the memory control circuit unit is configured to control the rewritable non-volatile memory module, and the method comprises:
measuring a temperature through a thermal sensor to obtain a first temperature value, and determining whether the first temperature value is greater than a first threshold value;
in response to determining that the first temperature value is greater than the first threshold value, performing a speed-down operation to reduce an access speed of the memory storage device to a first speed;

when the memory storage device performs data is accessed at the first speed, measuring the temperature through the thermal sensor to obtain a second temperature value, and determining whether the second temperature value is less than a second threshold value;
determining that the second temperature value being less than the second threshold value;
in response to determining that the second temperature value is less than the second threshold value, calculating a first temperature change rate within a specific time range, and determining a first adjustment percentage according to the first temperature change rate; and
calculating a second speed according to the first speed and the first adjustment percentage, and adjusting the access speed of the memory storage device to the second speed.

2. The memory adaptive temperature controlling method according to claim 1, wherein the second speed is less than the first speed.

3. The memory adaptive temperature controlling method according to claim 1, wherein calculating the first temperature change rate comprises:
calculating the first temperature change rate between a time point when the first temperature value is determined to be greater than the first threshold value and a time point when the second temperature value is determined to be less than the second threshold value.

4. The memory adaptive temperature controlling method according to claim 1, wherein determining the first adjustment percentage according to the first temperature change rate comprises:
querying a first look-up table according to the first temperature change rate to obtain the first adjustment percentage.

5. The memory adaptive temperature controlling method according to claim 1, wherein the method further comprises:
when the memory storage device performs the data access at the second speed, calculating a second temperature change rate within a preset time interval after every preset time interval;
determining a second adjustment percentage according to the second temperature change rate; and
calculating a third speed according to the second speed and the second adjustment percentage, and adjusting the access speed of the memory storage device to the third speed.

6. The memory adaptive temperature controlling method according to claim 5, wherein adjusting the access speed of the memory storage device to the third speed comprises:
determining whether a temperature change within the preset time interval is a rise or a decrease;
in response to determining that the temperature change is the rise, performing the speed-down operation to adjust the access speed of the memory storage device to the third speed; and
in response to determining that the temperature change is the decrease, performing a speed-up operation to adjust the access speed of the memory storage device to the third speed.

7. A memory storage device, comprising:
a connection interface unit configured to be coupled to a host system;
a rewritable non-volatile memory module;
a thermal sensor; and
a memory control circuit unit coupled to the connection interface unit, the rewritable non-volatile memory module, and the thermal sensor,
wherein the memory control circuit unit is configured to measure a temperature through the thermal sensor to obtain a first temperature value, and determine whether the first temperature value is greater than a first threshold value,
the memory control circuit unit is further configured to, in response to determining that the first temperature value is greater than the first threshold value, perform a speed-down operation to reduce an access speed of the memory storage device to a first speed,
the memory control circuit unit is further configured to, when the memory storage device performs data access at the first speed, measure the temperature through the thermal sensor to obtain a second temperature value, and determine whether the second temperature value is less than a second threshold value,
the memory control circuit unit is further configured to, in response to determining that the second temperature value is less than the second threshold value, calculate a first temperature change rate within a specific time range, and determine a first adjustment percentage according to the first temperature change rate, and
the memory control circuit unit is further configured to calculate a second speed according to the first speed and the first adjustment percentage, and adjust the access speed of the memory storage device to the second speed.

8. The memory storage device according to claim 7, wherein the second speed is less than the first speed.

9. The memory storage device according to claim 7, wherein an operation of calculating the first temperature change rate comprises:
calculating the first temperature change rate between a time point when the first temperature value is determined to be greater than the first threshold value and a time point when the second temperature value is determined to be less than the second threshold value.

10. The memory storage device according to claim 7, wherein an operation of determining the first adjustment percentage according to the first temperature change rate comprises:
querying a first look-up table according to the first temperature change rate to obtain the first adjustment percentage.

11. The memory storage device according to claim 7, wherein the memory control circuit unit is further configured to calculate a second temperature change rate within a preset time interval after every preset time interval when the memory storage device performs the data access at the second speed,
the memory control circuit unit is further configured to determine a second adjustment percentage according to the second temperature change rate, and
the memory control circuit unit is further configured to calculate a third speed according to the second speed and the second adjustment percentage, and adjust the access speed of the memory storage device to the third speed.

12. The memory storage device according to claim 11, wherein an operation of adjusting the access speed of the memory storage device to the third speed comprises:
determining whether a temperature change within the preset time interval is a rise or a decrease;
in response to determining that the temperature change is the rise, performing the speed-down operation to adjust the access speed of the memory storage device to the third speed; and in response to determining that the temperature change is the decrease, performing a speed-up operation to adjust the access speed of the memory storage device to the third speed.

13. A memory control circuit unit configured to control a rewritable non-volatile memory module comprised in a memory storage device, wherein the memory control circuit unit comprises:
a host interface configured to be coupled to a host system;
a memory interface configured to be coupled to the rewritable non-volatile memory module;
a thermal sensor; and
a memory management circuit coupled to the host interface, the memory interface, and the thermal sensor,
wherein the memory management circuit is configured to measure a temperature through the thermal sensor to obtain a first temperature value, and determine whether the first temperature value is greater than a first threshold value,
the memory management circuit is further configured to, in response to determining that the first temperature value is greater than the first threshold value, perform a speed-down operation to reduce an access speed of the memory storage device to a first speed,
the memory management circuit is further configured to, when the memory storage device performs data access at the first speed, measure the temperature through the thermal sensor to obtain a second temperature value, and determine whether the second temperature value is less than a second threshold value,
the memory management circuit is further configured to, in response to determining that the second temperature value is less than the second threshold value, calculate a first temperature change rate within a specific time range, and determine a first adjustment percentage according to the first temperature change rate, and
the memory management circuit is further configured to calculate a second speed according to the first speed and the first adjustment percentage, and adjust the access speed of the memory storage device to the second speed.

14. The memory control circuit unit according to claim 13, wherein the second speed is less than the first speed.

15. The memory control circuit unit according to claim 13, wherein an operation of calculating the first temperature change rate comprises:
calculating the first temperature change rate between a time point when the first temperature value is determined to be greater than the first threshold value and a time point when the second temperature value is determined to be less than the second threshold value.

16. The memory control circuit unit according to claim 13, wherein an operation of determining the first adjustment percentage according to the first temperature change rate comprises:
querying a first look-up table according to the first temperature change rate to obtain the first adjustment percentage.

17. The memory control circuit unit according to claim 13, wherein the memory management circuit is further configured to calculate a second temperature change rate within a preset time interval after every preset time interval when the memory storage device performs the data access at the second speed,
the memory management circuit is further configured to determine a second adjustment percentage according to the second temperature change rate, and
the memory management circuit is further configured to calculate a third speed according to the second speed and the second adjustment percentage, and adjust the access speed of the memory storage device to the third speed.

18. The memory control circuit unit according to claim 17, wherein an operation of adjusting the access speed of the memory storage device to the third speed comprises:
determining whether a temperature change within the preset time interval is a rise or a decrease;
in response to determining that the temperature change is the rise, performing the speed-down operation to adjust the access speed of the memory storage device to the third speed; and
in response to determining that the temperature change is the decrease, performing a speed-up operation to adjust the access speed of the memory storage device to the third speed.

* * * * *